United States Patent
Wang et al.

[11] Patent Number: 6,080,621
[45] Date of Patent: Jun. 27, 2000

[54] METHOD OF MANUFACTURING DYNAMIC RANDOM ACCESS MEMORY

[75] Inventors: Chuan-Fu Wang, Taipei Hsien; J. S. Jason Jenq, Pingtung, both of Taiwan

[73] Assignee: United Microelectronics Corp., Hsinchu, Taiwan

[21] Appl. No.: 09/165,253

[22] Filed: Oct. 1, 1998

[30] Foreign Application Priority Data

Jul. 9, 1998 [TW] Taiwan ................................ 87111098

[51] Int. Cl.[7] ................ H01L 21/8242; H01L 21/8234; H01L 21/8249
[52] U.S. Cl. .................... 438/253; 438/238; 438/235; 438/239; 438/240; 438/254; 438/255; 438/396; 438/397; 438/398
[58] Field of Search ................................. 438/235, 238, 438/239, 240, 254, 255, 396, 397, 398, 253

[56] References Cited

U.S. PATENT DOCUMENTS

| | | | |
|---|---|---|---|
| 5,643,819 | 7/1997 | Tseng | 438/396 |
| 5,702,989 | 12/1997 | Wang et al. | 438/397 |
| 5,706,164 | 1/1998 | Jeng | 361/321.4 |
| 5,726,086 | 3/1998 | Wu | 438/253 |
| 5,744,833 | 4/1998 | Chao | 257/308 |
| 5,763,304 | 6/1998 | Tseng | 438/239 |
| 5,780,338 | 7/1998 | Jeng et al. | 438/253 |
| 5,792,689 | 8/1998 | Yang et al. | 438/253 |
| 5,811,331 | 9/1998 | Ying et al. | 438/253 |
| 5,851,876 | 12/1998 | Jenq | 438/253 |
| 5,854,105 | 12/1998 | Tseng | 438/253 |
| 5,923,973 | 7/1999 | Chen et al. | 438/396 |
| 5,989,952 | 10/1999 | Jen et al. | 438/253 |

*Primary Examiner*—Brian Dutton
*Assistant Examiner*—Brook Kebede
*Attorney, Agent, or Firm*—J. C. Patents; Jiawei Huang

[57] ABSTRACT

A method of forming a DRAM capacitor that utilizes cap layers and spacers to surround the gate and bit line so that the necessary contact openings in a DRAM can be formed in two self-aligned contact processing operations. The capacitor of the DRAM is fabricated by forming contact node and openings within an insulating layer above a substrate, and then forming a first conductive layer conformal to the surface profile of the substrate above the substrate structure. Next, spacers are formed on the sidewalls of the conductive layer, and then a second conductive layer is formed filling the spacer between the spacers and over the substrate structure. Thereafter, a portion of the first conductive layer and the second conductive layer is removed to expose the spacers and the insulating layer. Finally, the spacers and the insulating layer are removed to expose a lower electrode structure that comprises the first and the second conductive layers.

20 Claims, 6 Drawing Sheets

METHOD OF MANUFACTURING DYNAMIC RANDOM ACCESS MEMORY

CROSS-REFERENCE TO RELATED APPLICATION

This application claims the priority benefit of Taiwan application Ser. No. 87111098, filed Jul. 9, 1998, the full disclosure of which is incorporated herein by reference.

BACKGROUND OF THE INVENTION

1. Field of Invention

The present invention relates to a method of manufacturing integrated circuits. More particularly, the present invention relates to a method of manufacturing dynamic random access memory (DRAM).

2. Description of Related Art

As microprocessors become more powerful, the amount of software programs that can be simultaneously handled inside a computer increases exponentially. Consequently, the amount of memory necessary for storing data increases correspondingly, and hence high-efficiency storage capacitors are in great demand, too. As the level of integration of DRAM increases, DRAM cells are now constructed from just one transfer field effect transistor and a storage capacitor. FIG. 1 is an equivalent circuit diagram of a DRAM cell. A DRAM is normally constructed from an array of these cells. A binary bit is stored in the capacitor C of each cell. In general, when the capacitor C is free of charges, a logic state of "0" is defined.

On the other hand, when the capacitor C is fully charged, a logic state of "1" is defined. A capacitor C has an upper electrode (cell electrode) 100 and a lower electrode (storage electrode) 101 with a layer of dielectric 102 sandwiched between the two to provide the necessary dielectric constant. In addition, the capacitor C is coupled to a bit line (BL), and reading and writing to and from the DRAM memory is achieved by charging or discharging the capacitor C. Charging and discharging of the capacitor is carried out through the control of a transfer field effect transistor (TFET).

The source terminal of the transfer transistor is connected to the bit line BL, and the drain terminal of the transfer transistor is connected to the capacitor C. The transfer transistor is switched on or off through a selection signal coming from a word line WL, which is connected to the gate terminal of the transfer transistor. Hence, whether the capacitor C is connected to the bit line allowing for charging or discharging of the capacitor depends upon the selection signal passed to the gate terminal.

Functionally, the capacitor can be regarded as the heart of a DRAM device. When the quantities of electric charges stored in a capacitor are increased, data coming from the memory will be less affected by noise surrounding the communication system. In general, the charge storage capacity of a capacitor can be increased in several ways, including: 1. Choosing a material having a high dielectric constant to form the dielectric film layer. 2. Reducing the thickness of the dielectric film layer. 3. Increasing the surface area of a capacitor.

Nowadays, many materials with high dielectric constant are developed including tantalum pentoxide ($Ta_2O_5$), $Pb(Zr,Ti)O_3$ or PZT and $(Ba,Sr)TiO_3$ or BST. To increase the surface area of a capacitor, a three-dimensional capacitor such as the so-called stacked type and trench type are now commonly used. For a 64 Mbit DRAM, for example, one method of further increasing the surface area of a capacitor is to extend the electrode and dielectric film layer horizontally and then stack the layers up to form a fin-type stacked capacitor. An alternative method is to allow the electrode and the dielectric film layer to extend vertically up to form a cylindrical-type stacked capacitor.

Description related to the formation of a fin-type capacitor can be found in an article by Ema et al. with the title "3-Dimensional Stacked Capacitor Cell for 16M and 64M DRAMs" published in International Electron Devices Meeting, pp 592–595, December 1988, or U.S. Pat. No. 5,071,783, U.S. Pat. No. 5,126,810 and U.S. Pat. No. 5,206,787. Description related to the formation of a cylindrical-type capacitor can be found in another article by Wakamiya et al. with the title "Novel Stacked Capacitor Cell for 64Mb DRAM" published in Symposium on VLSI Technology Digest of Technical Papers, pp 69–70, 1989, or U.S. Pat. No. 5,077,688.

FIG. 2 is a cross-sectional view showing a DRAM having a conventional cylindrical capacitor. A DRAM is constructed above the surface of a substrate 200 within a specially defined active region that is surrounded by isolating insulator 201. The field effect transistor 202 of a DRAM includes a gate structure 203 and source/drain regions 204 and 205. The gate structure 203 includes a cap layer 209 on top and sidewall spacers 210 on each side, while the bit line 222 is electrically coupled with the source/drain region 204 of the transistor.

The bit line 222 is formed by first forming a dielectric layer 212 over the substrate 200, and then forming a self-aligned contact opening 214 using conventional photolithographic and etching processes. Finally, a conductive layer is deposited, filling the contact opening 214, and followed by patterning the conductive layer to form the bit line 222. The storage electrode 250 of the capacitor 255 is formed by first depositing a silicon oxide layer 226 over the substrate 200, and then depositing a borophosphosilicate glass (BPSG) layer 228 to form a planar surface. Next, the BPSG layer 228 and the silicon oxide layer 226 are patterned to form the contact opening 234.

Thereafter, a polysilicon layer 250a and another borophosphosilicate layer (not shown in the FIG. 2 are formed, patterned and then doped. Thereafter, another doped polysilicon layer is formed over the substrate 200 and then etched back to form doped polysilicon sidewall spacers 250b. Next, the borophosphosilicate glass layer is removed to expose the doped polysilicon layers 250a and 250b. The exposed polysilicon layers 242a and 242b together form the storage electrode 250. Finally, a dielectric thin film 252 and a conductive layer 254 are formed sequentially over the substrate 200 to complete the formation of a DRAM capacitor 255.

When the borophosphosilicate glass layer 228 and the silicon oxide layer 226 are etched to form the contact opening 234 of the cylindrical capacitor, the position of the opening 234 can be displaced due to the inherent difficulties in aligning a narrow width using conventional photolithographic techniques. In some cases, if sideward displacement is large, etching may result in actual damage to the bit line 222. When the bit line 222 is damaged, subsequently deposited doped polysilicon inside the contact opening 234 may short-circuit with the bit line 222.

Furthermore, although the cylindrical-shaped storage electrode 250 of the capacitor 255 is able to increase the capacitance of the memory device a little, the increase in capacitance may be less than the degree of shrinkage in device area due to a higher level of integration.

In light of the foregoing, there is a need to improve the method of fabricating dynamic random access memory and its capacitor.

SUMMARY OF THE INVENTION

Accordingly, the present invention is to provide a method of forming bit lines suitable for high-level integrating of DRAM devices and capable of preventing damages that may arise due to subsequent etching of a neighboring dielectric layer to form a contact opening.

In another aspect, this invention provides a method of fabricating DRAM capacitor capable of increasing its effective surface area within a given chip area.

To achieve these and other advantages and in accordance with the purpose of the invention, as embodied and broadly described herein, the invention provides a method of manufacturing a DRAM capacitor. The method comprises the steps of first providing a substrate having a field effect transistor formed thereon, and then forming a dielectric layer over the substrate. Next, the dielectric layer is patterned to form a self-aligned contact opening exposing one of the source/drain regions of the field effect transistor. Thereafter, a conductive layer and a first insulating layer are sequentially formed over the dielectric layer. Then, the conductive layer and the first insulating layer are patterned to form a bit line that has an insulating cap layer on top. Subsequently, a silicon-rich oxide layer is formed over the substrate, and then the silicon nitride layer is etched back to form spacers on the sidewalls of the bit line. The sidewall spacers are used for protecting the bit line against damage when the dielectric layer is subsequently patterned to form the self-aligned contact opening of the capacitor. Next, a silicon oxide layer is formed over the substrate, and then a borophosphosilicate glass layer is deposited over the silicon oxide layer to form a planar surface. Thereafter, an etching stop layer and a second insulating layer are sequentially formed over the borophosphosilicate glass layer. Then, a self-aligned contact opening that exposes another source/drain region of the transistor is formed and passes through the second insulating layer, the etching stop layer, the borophosphosilicate glass layer and the dielectric layer. Next, a first conductive layer is formed inside the self-aligned contact opening so that the source/drain region is electrically connected. Then, an opening is formed in the second insulating layer using the etching stop layer as a terminal layer. Thereafter, a second conductive layer conformal to the surface profile is formed above the substrate, and then spacers are formed on the sidewalls of the second conductive layer. Subsequently, a third conductive layer is formed over the substrate structure so that the conductive material completely fills the space between the spacers. After that, a portion of the second conductive layer and the third conductive layer is removed to expose the spacers and the second insulating layer. Finally, the spacers and the second insulating layer are removed to form a cylindrical storage electrode structure comprising the first, the second and the third conductive layers.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
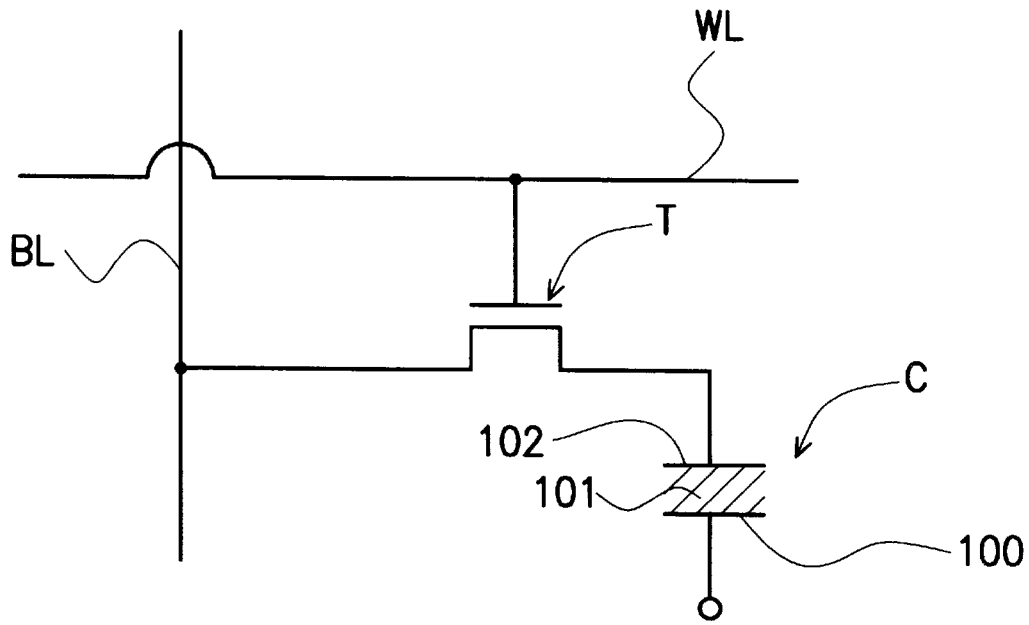
FIG. 1 is an equivalent circuit diagram of a DRAM cell.
Figure 2:
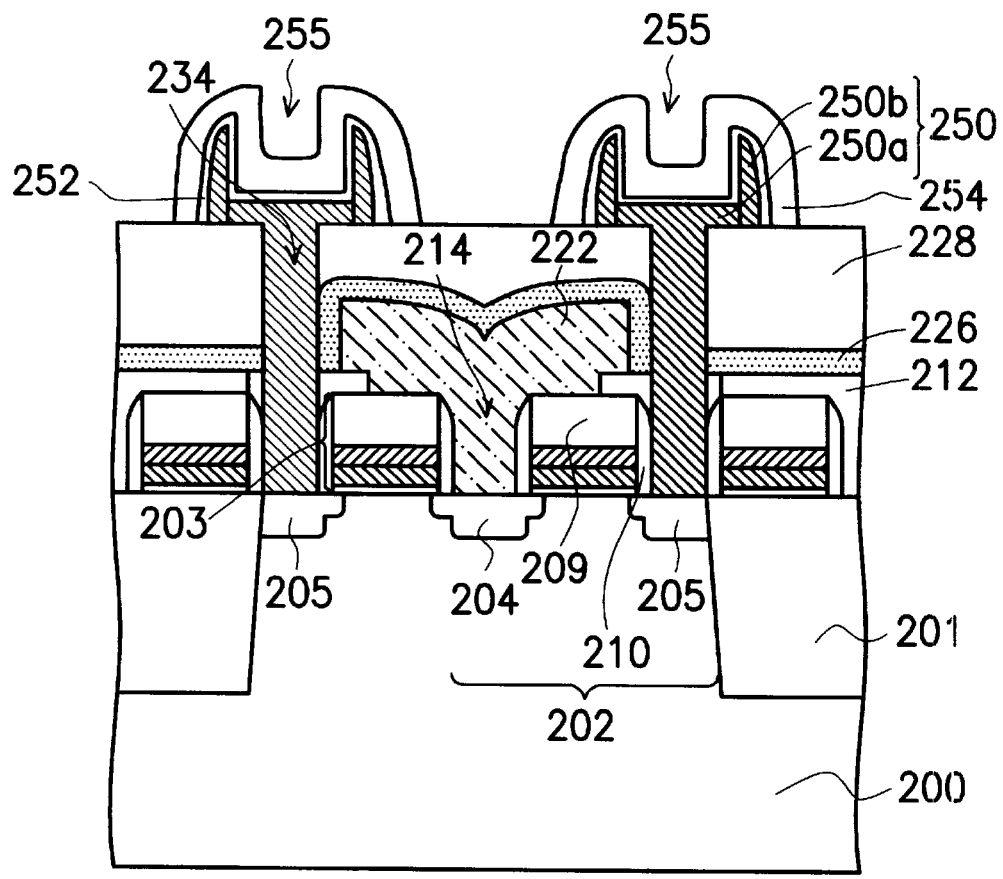
FIG. 2 is a cross-sectional view showing a DRAM having a conventional cylindrical capacitor.

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3H are cross-sectional views showing the progression of manufacturing steps in forming a DRAM capacitor according to one preferred embodiment of this invention.

Figure 3A:
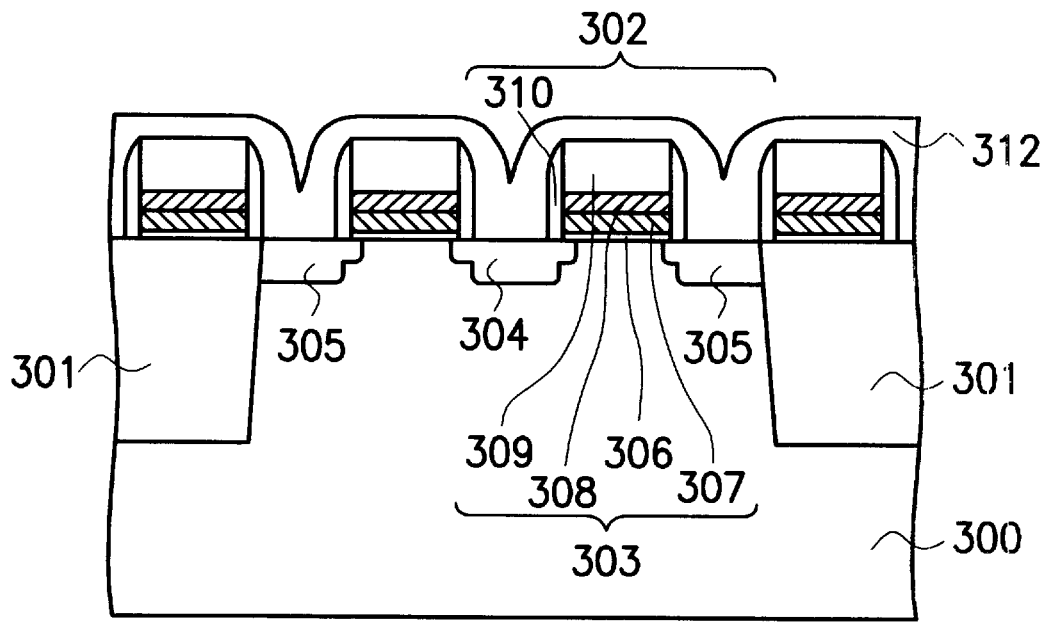
FIGS. 3A through 3H are cross-sectional views showing the progression of manufacturing steps in forming a DRAM capacitor according to one preferred embodiment of this invention.

First, as shown in FIG. 3A, a substrate 300, for example, a P-type silicon substrate is provided. Next, insulating layers 301 are formed on the substrate 300 marking out active device regions, and then a DRAM field effect transistor 302 is formed in the device region. The field effect transistor 302 includes a gate 303 and source/drain regions 304 and 305. The gate 303 has a composite structure that includes a gate oxide layer 306, a doped polysilicon layer 307, a metal silicide layer 308 such as tungsten silicide ($WSi_2$), and a cap layer 309 such as silicon nitride ($SiN_x$), each having thickness of about 100 Å, 1000 Å, 1000Å and 2000 Å, respectively.

In addition, spacers 310 are formed on the sidewalls of the gate structure 303. The spacers 310 are formed by first depositing a layer of silicon nitride having a thickness of about 1500 Å over the substrate 300 and the gate structure 303, and then etching back the silicon nitride layer. Thereafter, a dielectric layer 312 is formed over the substrate 300 structure. The dielectric layer 312 preferably has a thickness of about 1000–2000 Å and is formed, for example, by depositing silicon oxide using a chemical vapor deposition (CVD) method.

Figure 3B:
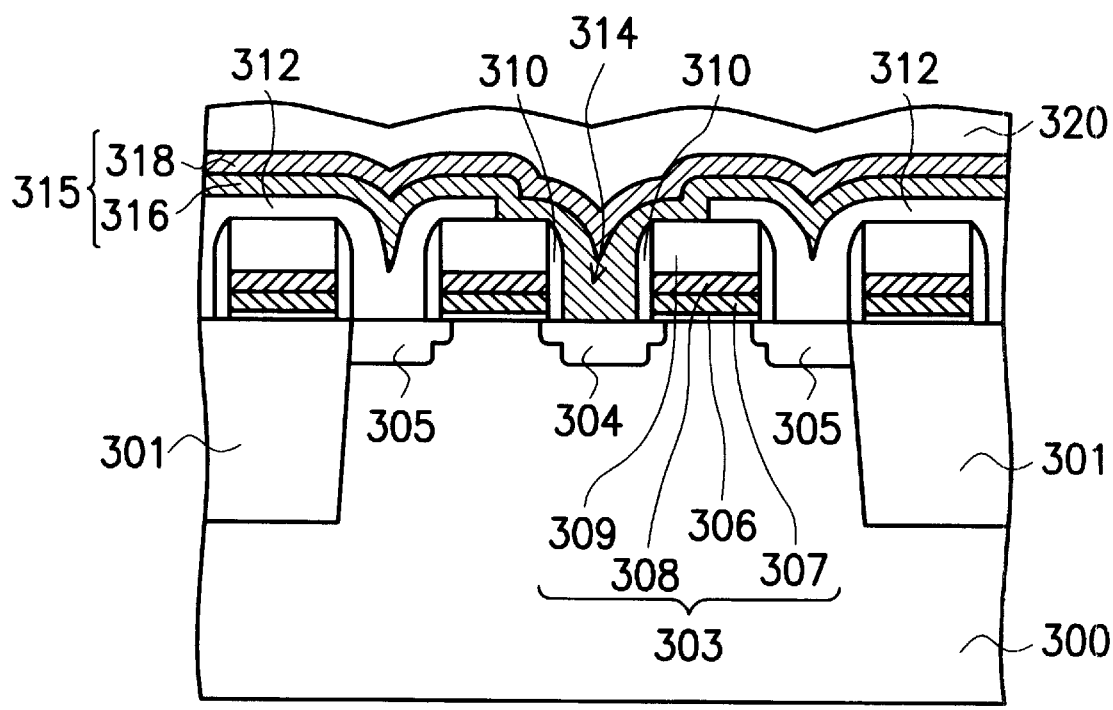

Next, as shown in FIG. 3B, the dielectric layer 312 is patterned to form a self-aligned contact opening 314 exposing a source/drain region 304. Subsequently, a conductive layer 315 is formed over the substrate structure 300 and completely fills the self-aligned contact opening 314 so as to make electrical connection with the source/drain region 304. The conductive layer 315 has a composite structure that includes a doped polysilicon layer 316 and a metal silicide layer 318 on top.

The doped polysilicon layer 316 preferably has a thickness of about 1000 Å and can be formed using, for example, a low-pressure chemical vapor deposition (LPCVD) method. The metal silicide layer 318 preferably has a thickness of about 1000 Å and can be a tungsten silicide, cobalt silicide or a titanium silicide layer. Next, a cap layer 320 is formed over the substrate 300 structure. The cap layer 320 preferably having a thickness of about 2000 Å is formed by, for example, depositing silicon-rich oxide (SRO) using a chemical vapor deposition method.

Figure 3C:
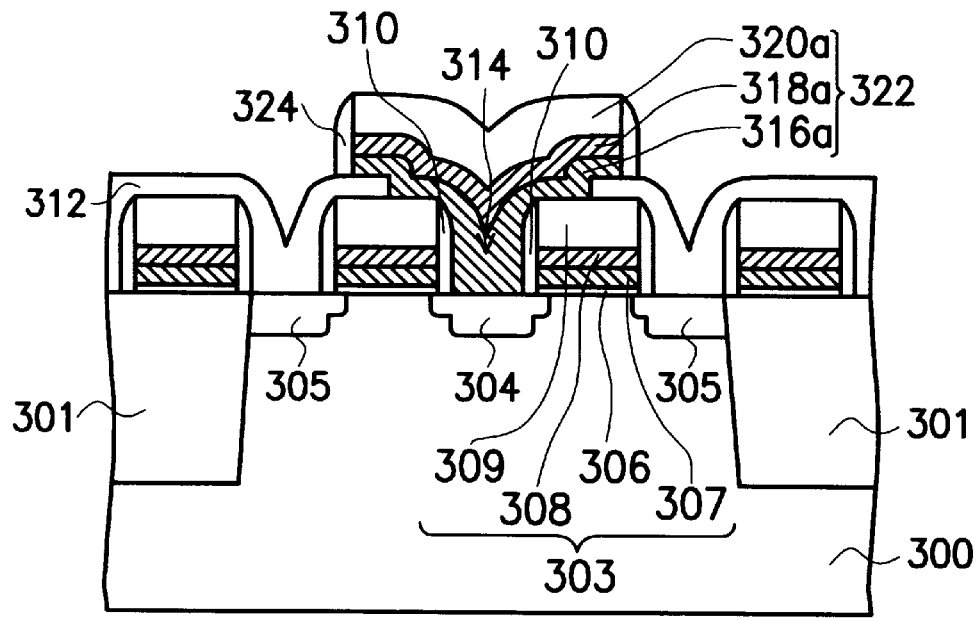

Thereafter, as shown in FIG. 3C, the cap layer 320, the metal silicide layer 318 and the doped polysilicon layer 316 are patterned to form a cap layer 320a, a metal silicide layer 318a and doped polysilicon layer 316a. The cap layer 320a, the metal silicide layer 318a and the doped polysilicon layer 316a together constitute a bit line 322. Next, spacers 324 are formed on the sidewalls of the bit line 322. The spacers 324 preferably have a thickness of about 1500 Å and are formed by depositing silicon-rich oxide (SRO) over the substrate structure, and then performing an anisotropic etching operation.

One of the major characteristics of this invention is that the bit line 322 has a cap layer 320a on top and spacers 324 on its sides. Therefore, the bit line 322 not only is fully protected by the surrounding cap layer 320a and spacers 324, but the surrounding layers can also serve as a guide in subsequent formation of a self-aligned contact opening as well. Consequently, this invention is capable of avoiding photolithographic alignment problems due to an increase in the level of integration.

Figure 3D:
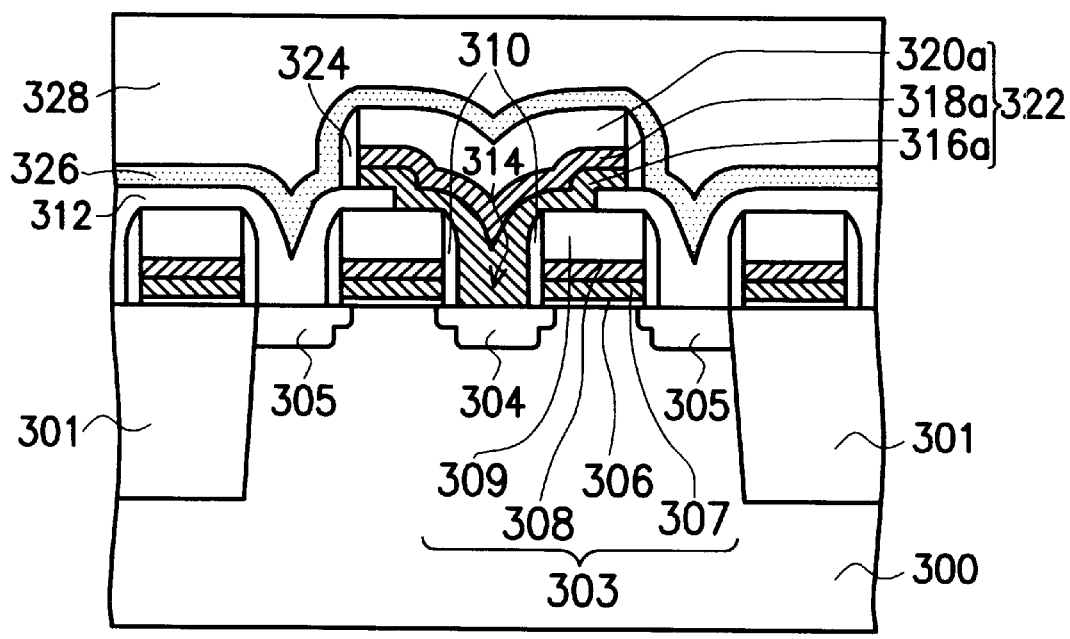

Next, as shown in FIG. 3D, a dielectric layer 326 is formed over the substrate 300 structure. The dielectric layer 326 preferably has a thickness of about 2000 Å and is formed, for example, by depositing silicon oxide using an atmospheric pressure chemical vapor deposition method. Thereafter, another dielectric layer 328 for planarizing the substrate structure is deposited over the dielectric layer 326. The dielectric layer 328 can be, for example, a borophosphosilicate glass (BPSG) layer formed by first depositing borophosphosilicate glass over the substrate structure to a thickness of about 7500 Å using a chemical vapor deposition method. Then, the BPSG is heated to a temperature of about 800° C. to cause a thermal flow. Finally, the BPSG layer is etched back to obtain a planar dielectric layer 328 having a thickness of about 5000 Å.

Figure 3E:
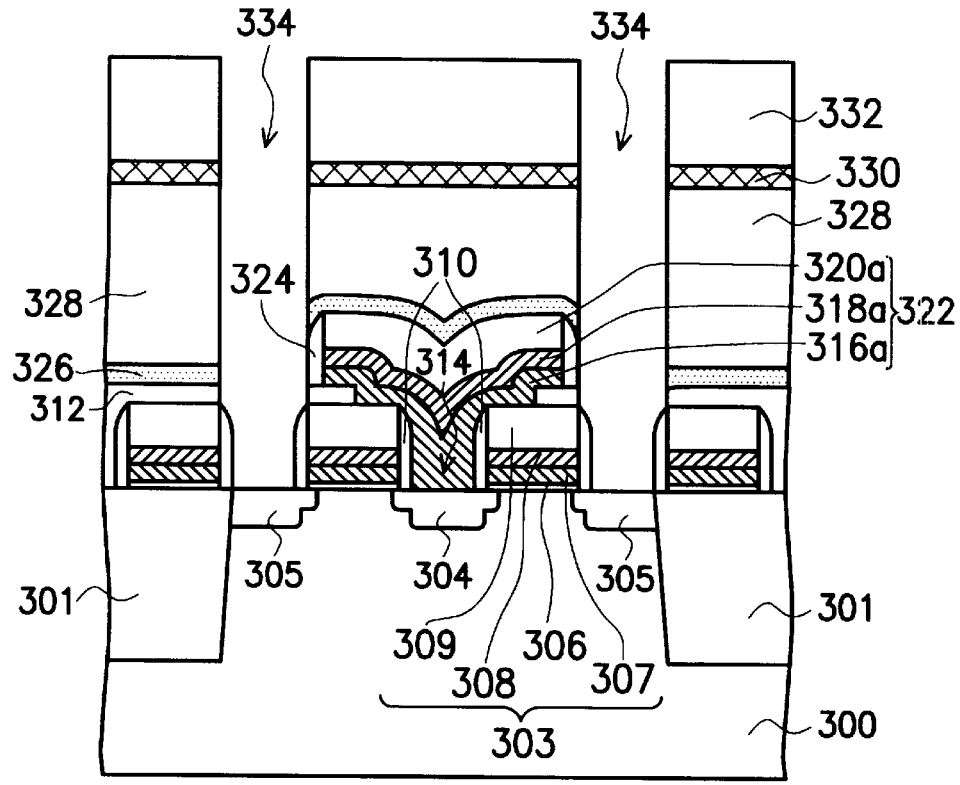

Subsequently, as shown in FIG. 3E, an etching stop layer 330 and an insulating layer 332 are sequentially formed over the substrate structure 300. Thereafter, the insulating layer 332, the etching stop layer 330, the dielectric layers 328, 326 and 312 are patterned to form self-aligned contact openings 334 that expose the respective source/drain regions 305. The etching stop layer has a thickness of about 100 Å and can be a silicon nitride layer formed using, for example, a low-pressure chemical vapor method.

The insulating layer 332 has a thickness that depends on the desired capacitance can be a silicon oxide layer formed using, for example, a chemical vapor deposition method. Since both the bit line 322 and the gate structure 303 are surrounded by cap layers 320a, 309 and sidewall spacers 324, 310, and the cap layers (320a, 309), the spacers (324, 310), and the dielectric layers (328, 326, 312) all have different etching rates, the cap layers (320a, 309) and the spacers (324, 310) can serve as an guides in the process of forming the self-aligned contact opening 334 as well as protecting the bit line 322 and the gate structure 303 against etchant. Hence, etching damage due to photolithographic misalignment is reduced to a minimum.

Figure 3F:
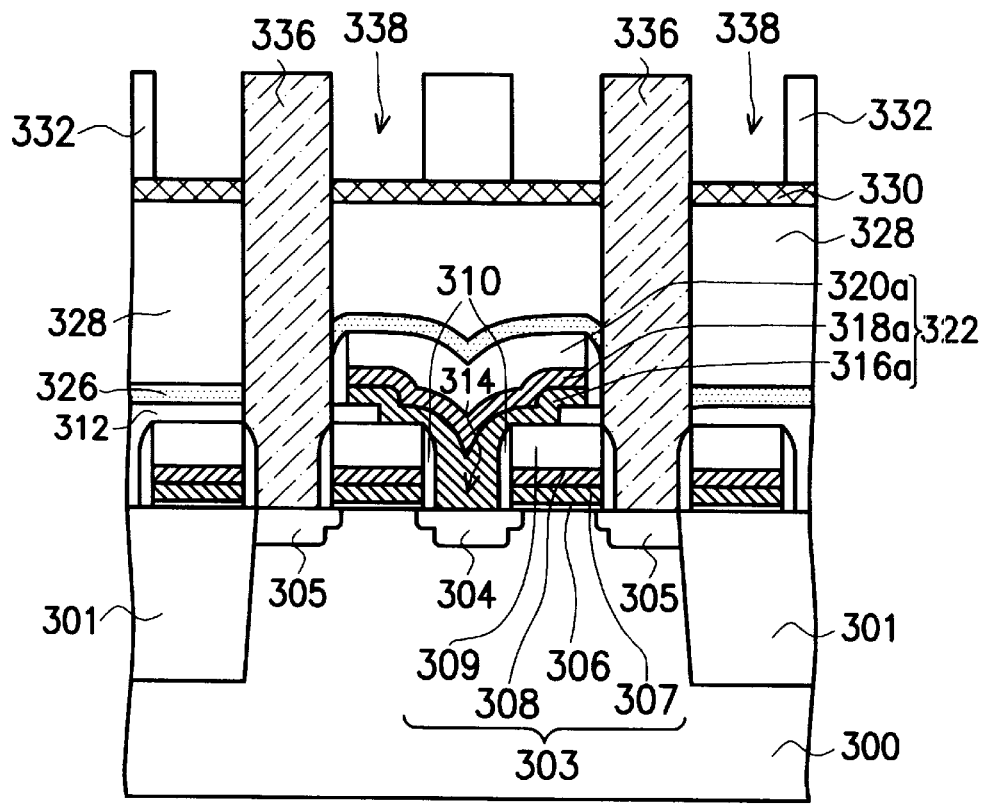

Next, as shown in FIG. 3F, conductive material is deposited into the self-aligned contact opening 334 to form a conductive layer 336, thereby forming a contact node that couples electrically with the source/drain regions 305. Thereafter, using the etching stop layer 330 as a terminal layer, the insulating layer 332 is patterned to form openings 338. The method of forming the contact node includes the steps of first depositing conductive material into the self-aligned contact opening 334 and over the insulating layer to form a conductive layer 336. Then, excess conductive layer 336 above the insulating layer 332 is etched back to form plugs 336 within the self-aligned contact openings 334. The conductive layer 336 can be a doped polysilicon layer formed using, for example, a chemical vapor deposition method.

Figure 3G:
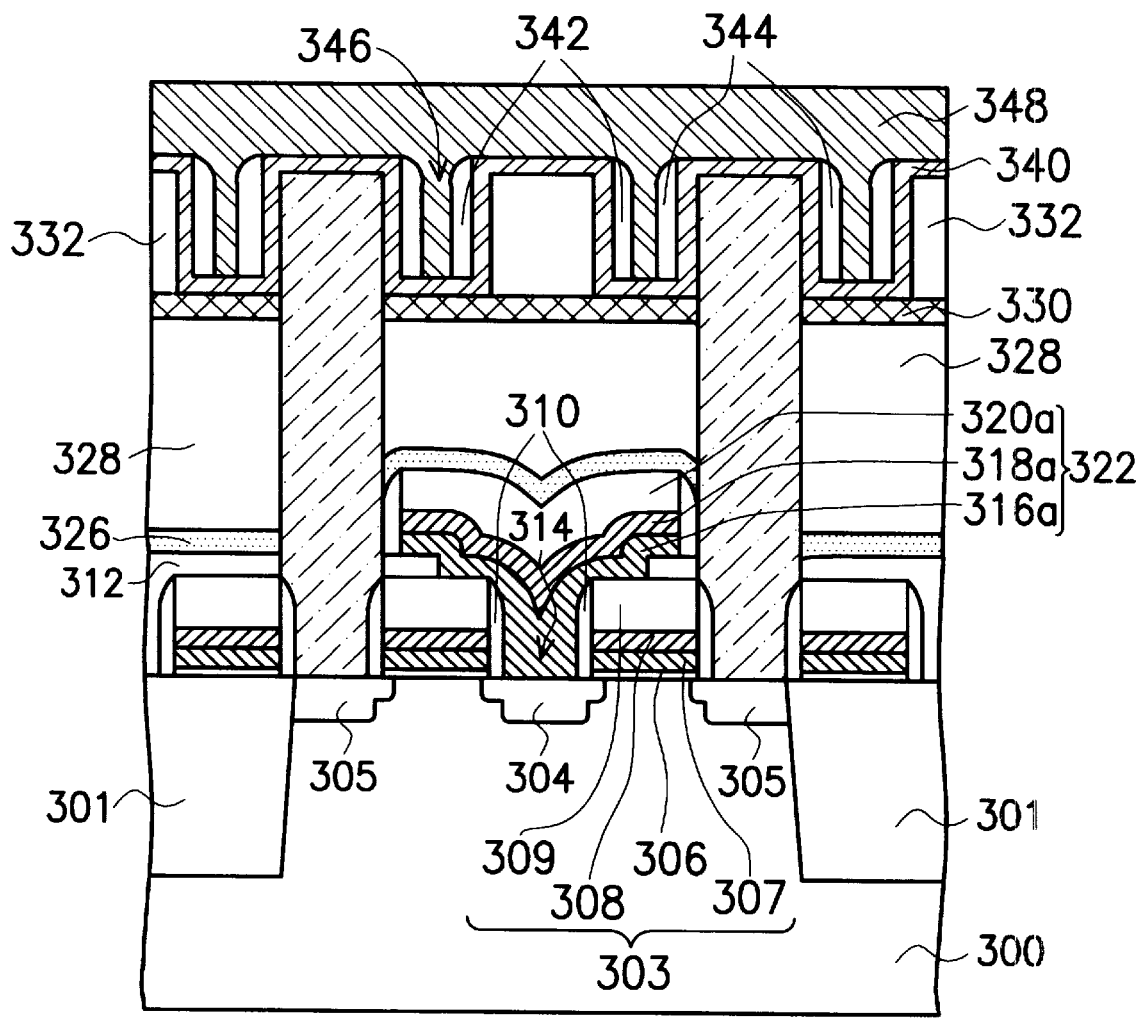

Next, as shown in FIG. 3G, a conductive layer 340 conformal to the surface profile is formed above the substrate 300. The conductive layer 340 covers the exposed etching stop layer 330, the insulating layer 332 and the conductive layer 336. Thereafter, spacers 342 and 344 are respectively formed on the sidewalls of the conductive layer 340 that covers the insulating layer 332 and the sidewalls of the conductive layer 340 that covers the conductive layer 336.

In the subsequent step, another conductive layer 348 is formed over the conformal conductive layer 340 that fills the space 346 between the spacers 342 and 344 as well. The conductive layers 340 and 348 can both be doped polysilicon layer formed using, for example, a chemical vapor deposition. The spacers 342 and 344 can be made from insulating material that includes silicon oxide. The method of forming the spacers 342 and 344 includes the steps of first forming an insulating layer over the substrate 300. Then, the insulating layer is etched back to form spacers 342 and 344 on the sidewalls of the conductive layer 340.

Figure 3H:
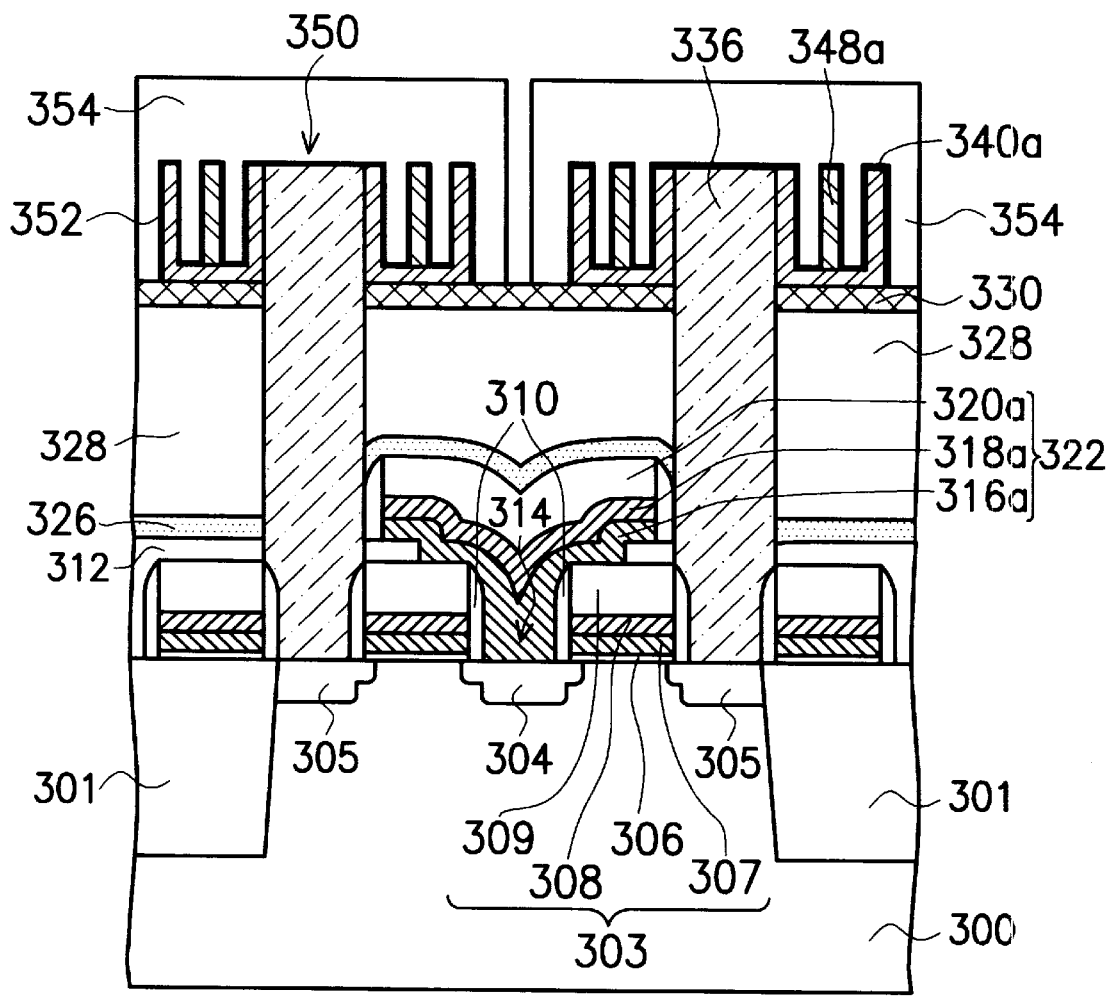

Thereafter, as shown in FIG. 3H, a portion of the conductive layer 348 and the conductive layer 340 is removed to expose the spacers 342, the spacers 344 and the insulating layer 322. In a conventional process, a chemical-mechanical polishing (CMP) operation is carried out to polish away the conductive layers 348, 340 above the device surface until the spacers 342, 344 and insulating layer 332 are all exposed. Subsequently, using the etching stop layer 330 as the terminal layer, the spacers 342, 344 and the insulating layer 332 are removed to expose the conductive layers 336, 340a and 348a. The conductive layers 336, 340a and 348a together form a cylindrical storage electrode structure 350.

Typically, the spacers 342, 344 and the insulating layer 332 are removed by performing an isotropic etching operation using the silicon nitride etching stop layer 330 as the terminal layer. Generally, a diluted hydrofluoric acid (HF) solution or a buffered oxide etchant (BOE) can be used to remove silicon oxide spacers 342, 344 and insulating layer 332 concurrently. Finally, a dielectric thin film 352 and then a conductive layer 354 are formed over the storage electrode structure 350 to complete the fabrication of the DRAM capacitor.

The dielectric thin film 352 can be a silicon oxide layer, a silicon nitride/silicon oxide (NO) composite layer, a silicon oxide/silicon nitride/silicon oxide (ONO) composite layer, a tantalum pentoxide ($Ta_2O_5$), Pb(Zr, Ti)$O_3$ or PZT and (Ba, Sr)TiO$_3$ or BST, all of which are made from materials having a high dielectric constant. The conductive layer 354 can be a doped polysilicon layer formed by first depositing polysilicon using a chemical vapor deposition, and then doping N-type impurities such as arsenic ions to increase its electrical conductivity. Alternatively, the conductive layer 354 can be formed by simply depositing a metallic layer using a physical vapor deposition (PVD) method.

In summary, major aspect of this invention includes:

1. The enclosure of gate and bit line by cap layers and spacers enable the double formation of self-aligned contact openings with ease. Therefore, limitations on photolithographic operation are relieved, and hence this invention is capable of producing devices having a higher level of integration.

2. The storage electrode of this invention has a multi-cylinder profile. Therefore, effective surface area of the capacitor is increased, and hence the capacity to store electric charges is greatly improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing dynamic random access memory, the method comprising the steps of:
   providing a substrate having a field effect transistor formed thereon, wherein the field effect transistor includes a first source/drain region and a second source/drain region;
   forming a bit line electrically coupled with the first source/drain region, wherein the bit line is further covered on top by a cap layer;
   forming first spacers on the sidewalls of the bit line;
   forming a first dielectric layer, an etching stop layer and a first insulating layer sequentially over the substrate structure;
   forming a self-aligned contact opening that passes through the first dielectric layer, the etching stop layer and the first insulating layer, and exposes the second source/drain region;
   depositing a conductive material into the self-aligned contact opening to form a first conductive layer that couples electrically with the second source/drain region;
   patterning the first insulating layer to form an opening in the first insulating layer;
   forming a second conductive layer conformal to the surface profile of the substrate so that the etching stop layer, the first conductive layer and the first insulating layer are covered;
   forming second spacers over the second conductive layer that covers the first insulating layer and third spacers over the second conductive layer that covers the first conductive layer;
   depositing conductive material over the substrate structure and into the space between the second spacers and the third spacers forming a third conductive layer;
   removing a portion of the third conductive layer and the second conductive layer to expose the first insulating layer, the second spacers and the third spacers;
   removing the first insulating layer, the second and the third spacers to expose a storage electrode structure comprised of the first, the second and the third conductive layers;
   forming a dielectric thin film over the exposed storage electrode structure; and
   forming a fourth conductive layer over the dielectric thin film to function as a cell electrode.

2. The method of claim 1, wherein the step of forming the bit line includes sequentially forming a fifth conductive layer and a second insulating layer over the substrate structure, and then patterning the fifth conductive layer and the second insulating layer to form the bit line having an overhead cap layer.

3. The method of claim 2, wherein the step of forming the fifth conductive layer includes depositing doped polysilicon and metal silicide.

4. The method of claim 1, wherein the cap layer and the first spacers have etching rates different from the dielectric layer.

5. The method of claim 4, wherein the step of forming the first spacers includes depositing silicon-rich oxide.

6. The method of claim 2, wherein the step of forming the second insulating layer includes depositing silicon-rich oxide.

7. The method of claim 1, wherein the etching stop layer has an etching rate different from the first insulating layer.

8. The method of claim 7, wherein the material for forming the etching stop layer includes silicon nitride and the material for forming the first insulating layer includes silicon oxide.

9. The method of claim 1, wherein the material for forming the first, the second, the third and the fourth conductive layers includes doped polysilicon.

10. The method of claim 1, wherein after the step of forming the first conductive layer and before the step of patterning the first insulating layer, further includes an etching back operation.

11. The method of claim 1, wherein the step of removing a portion of the third conductive layer and a portion of the second conductive layer includes using an etching back method.

12. The method of claim 1, wherein the second and the third spacers have the same etching rate as the first insulating layer.

13. The method of claim 1, wherein the step of forming the dielectric thin film includes depositing to form a silicon oxide layer, a silicon nitride/silicon oxide composite layer, a silicon oxide/silicon nitride/silicon oxide composite layer, a tantalum pentoxide layer, a PZT layer or a BST layer.

14. The method of claim 1, wherein the step of removing a portion of the third conductive layer and a portion of the second conductive layer includes using a chemical-mechanical polishing method.

15. A method of manufacturing dynamic random access memory, the method comprising the steps of:
   providing a substrate having a field effect transistor formed thereon, wherein the field effect transistor includes a first source/drain region and a second source/drain region;
   forming a first dielectric layer over the substrate;
   patterning the first dielectric layer to form a first self-aligned contact opening that exposes the first source/drain region;
   forming a first conductive layer over the substrate structure, wherein the first conductive layer couples electrically with the first source/drain region;
   forming a silicon-rich oxide cap layer over the first conductive layer;
   patterning the first conductive layer and the silicon-rich oxide cap layer to form a bit line;
   forming silicon-rich oxide spacers on the sidewalls of the bit line;
   forming a second dielectric layer, an etching stop layer and an insulating layer over the substrate structure;
   forming a self-aligned contact opening that passes through the first dielectric layer, the second dielectric layer, the etching stop layer and the insulating layer and exposes the second source/drain region;
   depositing conductive material into the self-aligned contact opening to from a first conductive layer that couples electrically with the second source/drain region;

patterning the insulating layer to form an opening;

forming a second conductive layer conformal to the surface profile of the substrate such that the etching stop layer, the first conductive layer and the insulating layer are covered;

forming first spacers on the sidewalls of the second conductive layer that covers the first conductive layer, and forming second spacers on the sidewalls of the second conductive layer that covers the insulating layer;

depositing conductive material over the substrate structure and into the space between the first spacers and the second spacers to form a third conductive layer;

removing a portion of the third conductive layer and a portion of the second conductive layer to expose the insulating layer, the first spacers and the second spacers;

removing the insulating layer, the first spacers and the second spacers to expose a storage electrode structure comprising the first, the second and the third conductive layers;

forming a dielectric thin film over the exposed storage electrode structure; and forming a fourth conductive layer over the dielectric thin film to function as a cell electrode.

16. The method of claim 15, wherein the cap layer, the silicon-rich oxide spacers and the dielectric layer all have different etching rates.

17. The method of claim 15, wherein the etching stop layer and the insulating layer have different etching rates.

18. The method of claim 15, wherein the material for forming the first, the second, the third and the fourth conductive layer includes doped polysilicon.

19. The method of claim 15, wherein after the step of forming the first conductive layer but before the step of patterning the insulating layer, further includes an etching back operation.

20. The method of claim 15, wherein the step of removing a portion of the third conductive layer and a portion of the second conductive layer includes using a chemical-mechanical polishing method.

* * * * *